(12) United States Patent
Pekny et al.

(10) Patent No.: US 9,305,609 B2
(45) Date of Patent: Apr. 5, 2016

(54) SYSTEM AND METHOD OF COMMAND BASED AND CURRENT LIMIT CONTROLLED MEMORY DEVICE POWER UP

(75) Inventors: Ted Pekny, Sunnyvale, CA (US); Jeff Yu, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 876 days.

(21) Appl. No.: 12/112,831

(22) Filed: Apr. 30, 2008

(65) Prior Publication Data

US 2009/0274000 A1    Nov. 5, 2009

(51) Int. Cl.
*G11C 5/14*       (2006.01)
*G11C 7/20*       (2006.01)

(52) U.S. Cl.
CPC ... *G11C 5/14* (2013.01); *G11C 7/20* (2013.01)

(58) Field of Classification Search
CPC ........... G11C 5/14; G11C 5/144; G11C 5/148

USPC ......................................... 365/226, 227, 228
See application file for complete search history.

(56) References Cited

U.S. PATENT DOCUMENTS

| | | | |
|---|---|---|---|
| 4,780,854 A * | 10/1988 | Watanabe et al. | 365/226 |
| 7,715,268 B2 * | 5/2010 | Hsieh et al. | 365/228 |
| 2005/0276110 A1 * | 12/2005 | Sakurai | G11C 16/30 365/185.18 |
| 2007/0195630 A1 * | 8/2007 | Hwang et al. | 365/226 |
| 2009/0024856 A1 * | 1/2009 | Lee | 713/320 |

* cited by examiner

*Primary Examiner* — Han Yang
(74) *Attorney, Agent, or Firm* — Fletcher Yoder, P.C.

(57) ABSTRACT

Devices and systems for powering up a memory device, for example, are disclosed. One such memory device includes power up circuitry configured to receive an external power supply and to provide an internal power supply to the memory device upon receipt of a command. The power up circuitry may be configured to provide the internal power supply limited to a peak current, or may be configured to provide the internal power supply not limited to a peak current. The memory device may be, for example, a synchronous dynamic random access memory (SDRAM) device or Flash memory.

15 Claims, 8 Drawing Sheets

SYSTEM AND METHOD OF COMMAND BASED AND CURRENT LIMIT CONTROLLED MEMORY DEVICE POWER UP

BACKGROUND OF THE INVENTION

1. Field of the Invention

The present invention relates generally to powering up memory devices and, more particularly, to powering up memory devices on command or in a current-controlled manner.

2. Description of the Related Art

Electronic devices may employ one or more memory devices to store data for various purposes. For example, an electronic device may use a memory device to store data temporarily while the electronic device is active. Memory of this type may include random access memory (RAM). By way of example, synchronous dynamic random access memory (SDRAM) represents one form of RAM.

An electronic device may additionally or alternatively use a different memory device for long-term data storage when the electronic device is not active. Memory of this type may include non-volatile or Flash memory. By way of example, NAND Flash and NOR Flash represent common forms of Flash memory.

A memory controller may control a memory device using a variety of communication techniques; such techniques include standard parallel and serial peripheral interface (SPI). The memory controller may generally use commands to send data to be stored on a memory device, to access data stored on the memory device, or to adjust various settings regarding memory device operation.

When an electronic device powers up, the electronic device may provide a power supply voltage (VCC) to its electronic components, which may include one or more memory devices. When many electronic components of the electronic device power up in parallel, the electronic components may draw substantial power, which may place a constraint on the power supply of the electronic device. Moreover, many applications and standards may define peak current limits that should not be exceeded. A substantial draw of current on power up may not adhere to the standard.

DETAILED DESCRIPTION OF SPECIFIC EMBODIMENTS

Figure 1:
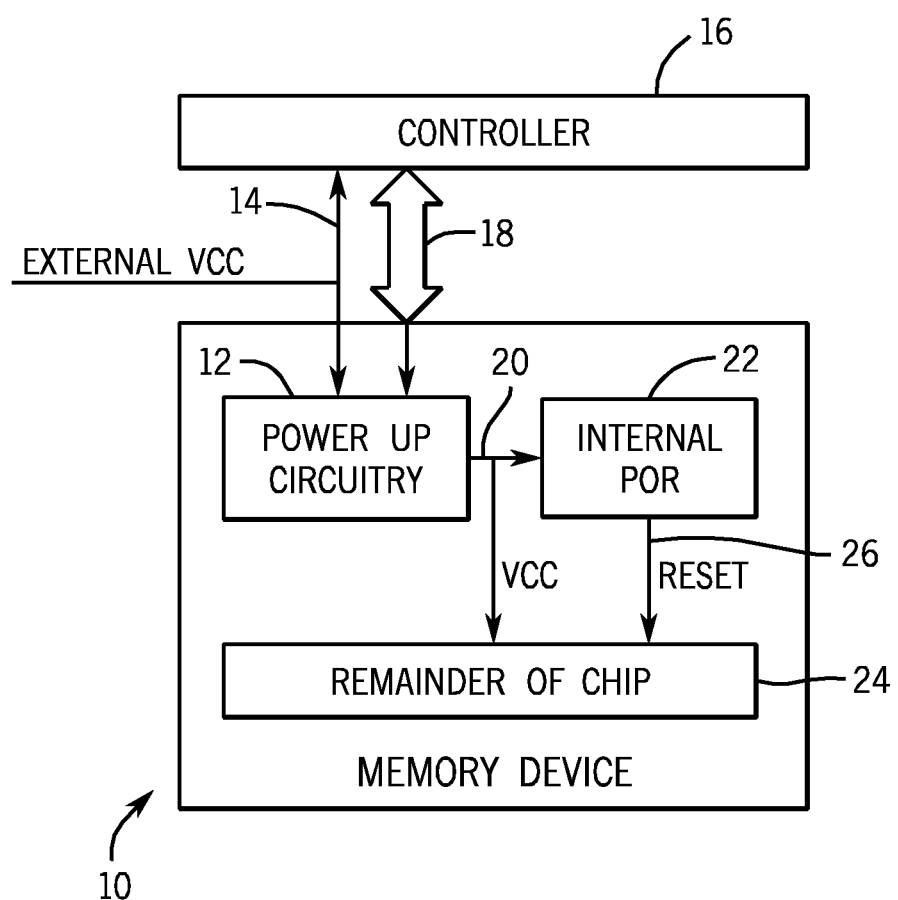
FIG. 1 is a block diagram representing a memory device having command based and current limit controlled power up circuitry in accordance with an embodiment.

FIG. 1 illustrates a memory device 10 having command based and current limit controlled power up circuitry in accordance with an embodiment. The memory device 10 may be of any type of memory, such as synchronous dynamic random access memory (SDRAM), NAND Flash memory, or NOR Flash memory. The memory device 10 includes power up circuitry 12, which may receive power from an external VCC 14 power supply. The external VCC 14 does not supply power directly to remaining circuitry of the memory device 10, which could draw a substantial amount of current powering up. Instead, the external VCC 14 supplies power to the power up circuitry 12, which includes circuitry for a controlled power up of the memory device 10.

Once the power up circuitry 12 has powered up, a controller 16 may send a command 18 to the power up circuitry 12 to begin powering up the remaining circuitry of the memory device 10. It should be noted that the controller 16 may communicate with the memory device 10 using any communication scheme. Thus, the controller 16 may issue the command 18 to the memory device 10 using a serial peripheral interface (SPI) protocol or a standard parallel protocol, for example.

When the controller 16 sends a first command 18 to the power up circuitry 12, the power up circuitry 12 may enter a current controlled VCC regulation phase in powering up the memory device 10. The power up circuitry 12 may supply an internal VCC 20 to an internal power on reset (POR) circuit 22 and to circuitry of a remainder of the chip 24. To prevent the remainder of the chip 24 from drawing excessive current while powering up, the internal VCC 20 may be limited to a peak current limit. The peak current limit may be determined by a specification or a standard, or may vary by application. For example, the peak current limit may be between 4 milliamps (mA) and 20 mA to comport with certain memory device standards and to prevent current spikes while the remainder of the chip 24 is powered on.

When the internal POR circuit 22 receives the internal VCC 20 power, the internal POR circuit 22 may transmit a reset signal 26 to the remainder of the chip 24 to reset the latches therein. After the remainder of the chip 24 has powered on and the latches of the remainder of the chip 24 have been reset, the controller 16 may issue a second command 18 to the power up circuitry 12. When the power up circuitry 12 receives the second command 18, the power up circuitry 12 may subsequently enter a normal VCC regulation mode. In the normal VCC regulation mode, the internal VCC 20 is no longer limited to a peak current limit, but rather may supply additional current as needed to achieve a specified reference voltage.

Figure 2:
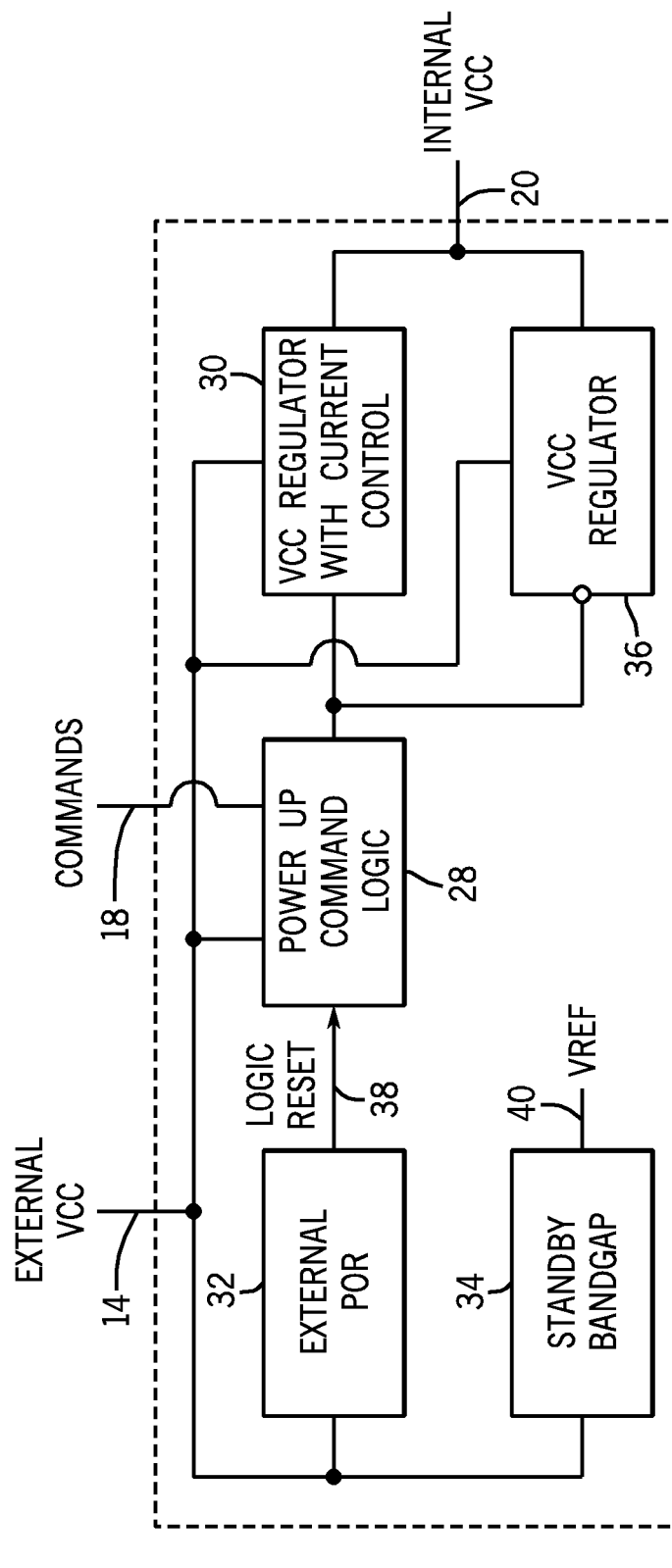
FIG. 2 is a block diagram representing the command based and current limit controlled power up circuitry of FIG. 1.

FIG. 2 depicts the power up circuitry 12 of FIG. 1 in greater detail. As shown in FIG. 2, the external VCC 14 supplies power to a number of subcircuits which make up the power up circuitry 12. The subcircuits may include power up command logic 28, a VCC regulator with current control 30, an external power on reset (POR) circuit 32, a standby band gap circuit 34, and a VCC regulator 36 without current control. It should be appreciated that the number of regulators may vary based on design constraints and applications. For example, a greater number of regulators may be employed to reduce possible voltage drops due to internal resistance in the memory device 10.

Upon receiving power from the external VCC 14, the external POR circuit 32 may generate a reset signal 38. The reset signal 38 resets all of the latches in the power up command logic 28. The amount of time required for the external POR circuit 32 to reset the latches in the power up command logic 28 is referred to herein as a time t1, which may vary depending on the logic configuration and design and may last approximately 250 microseconds (μs). Once the time t1 has passed, the power up command logic 28 may receive a first command 18 from the controller 16.

Upon receipt of the first command 18 from the controller 16, the power up command logic 28 may begin to power up other circuitry in the memory device 10 by activating the VCC regulator with current control 30. For example, the power up command logic 28 may issue a signal both to the VCC regulator with current control 30 and to the VCC regulator 36. Based on logic within the VCC regulator with current control 30 and the VCC regulator 36, only the VCC regulator with current control 30 may be activated by the signal.

Once activated, the VCC regulator with current control 30 may output the internal VCC 20 power supply. As discussed above, the internal VCC 20 supplies power to the internal POR 22 and the remainder of the chip 24. It should be noted that the internal VCC 20 power supply from the VCC regulator with current control 30 may be limited to a peak current. For example, the VCC regulator with current control 30 may limit the peak current to between 4 mA and 20 mA, which may prevent the remainder of the chip 24 from drawing large spikes of current from the external VCC 14.

As noted in the discussion associated with FIG. 1 above, the reset signal 26 from the internal POR circuit 22 serves to reset the latches in the remainder of the chip 24. The amount of time required for the internal POR circuit 22 to reset the latches in the power up command logic 28 is referred to herein as a time t2, which may vary depending on the configuration and design of the remainder of the chip 24 and may last approximately 250 μs. Once the time t2 has elapsed from the activation of the VCC regulator with current control 30, the power up command logic 28 may receive a second command 18 from the controller 16. Upon receipt of the second command, the power up command logic 28 may activate the VCC regulator 36 and to deactivate the current control aspect of the VCC regulator with current control 30, which may subsequently operate in tandem to output the internal VCC 20 power supply.

The standby bandgap circuit 34 may supply a reference voltage 40 (also labeled Vref) to the VCC regulator 36 and the VCC regulator with current control 30 (with current control now deactivated). The VCC regulator 36 and the VCC regulator with current control 30 (with current control deactivated) may both thereafter output the internal VCC 20 at the reference voltage 40 without limiting the current drawn from the external VCC 14.

Figure 3:
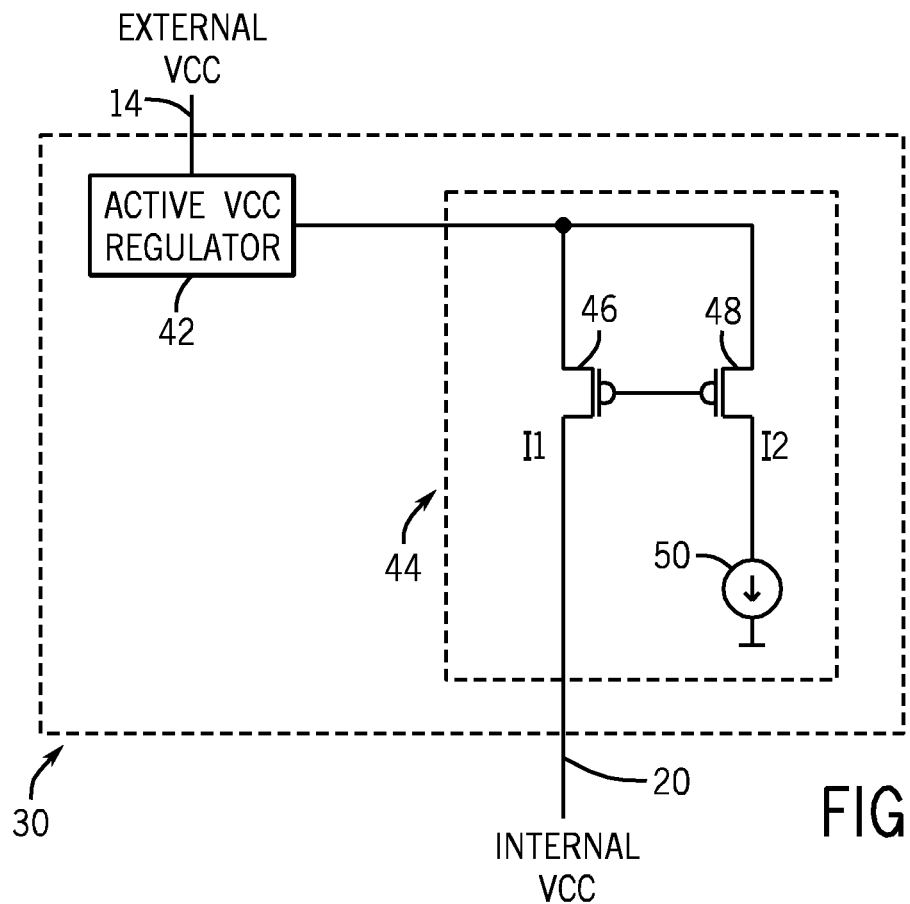
FIG. 3 is a block diagram representing a VCC regulator with current control in accordance with an embodiment.

FIG. 3 represents a more detailed view of the VCC regulator with current control 30 of the power up circuitry 12 of FIG. 2. The VCC regulator with current control 30 may include an active VCC regulator 42 and a current limiter circuit 44. The active VCC regulator 42 receives power from the external VCC 14 and supplies power at the proper voltage to the remainder of the chip 24. The current limiter circuit 44 limits the amount of current output to the internal VCC 20 to a specified value.

The current limiter circuit 44 may include, for example, a current mirror formed by a transistor 46 with a gate terminal tied to a gate terminal of a transistor 48, as illustrated in FIG. 3. A current source 50 may supply a reference current I2 across the transistor 48, which may be mirrored across transistor 46 as a current I1 according to a relationship between the ratios of channel width to channel length (W/L) of each transistor 46 and 48, $$I1 = \frac{(W/L)_{46}}{(W/L)_{48}} I2.$$

The (W/L) ratio of transistor 46 may be 85 times that of the transistor 48, and the current source 50 may supply a reference current I2 of 140-175 mA. Thus, the current I1 output to the internal VCC 20 by the VCC regulator with current control 30 may be approximately 18 mA. The current source 50 may represent any current source, such as the current source described in U.S. patent application Ser. No. 12/037,649, assigned to Micron Technology, Inc.

Figure 4:
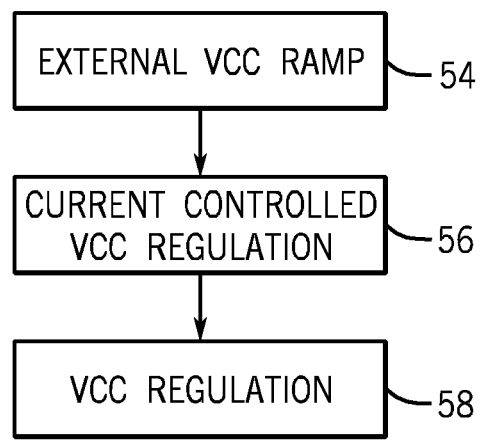
FIG. 4 is a flowchart depicting a method of powering up the memory device of FIG. 1 in accordance with an embodiment.

Turning to FIG. 4, a flowchart 52 depicts a method of powering up the memory device 10 using command based and current limit controlled power up circuitry, in accordance with an embodiment. Initially, an external VCC ramp phase 54 may begin when the external VCC 14 initially ramps up, supplying power to the power up circuitry 12 of the memory device 10 and to the controller 16. During the external VCC ramp phase 54, no additional circuitry of the memory device 10 draws power from the external VCC 14. Once a sufficient time t1 has elapsed to permit the logic of the power up circuitry 12 to reset, the controller 16 may send a first command 18 to the power up circuitry 12, causing the power up circuitry 12 to begin a current controlled VCC regulation phase 56.

In the current controlled VCC regulation phase 56, the power up circuitry 12 supplies the internal VCC 20 to the internal POR circuit 22 and to the remainder of the chip 24. However, for the duration of the current controlled VCC regulation phase 56, the current is limited to prevent current spikes drawn on the external VCC 14 while the remaining circuitry of the memory device 10 powers up. Once a sufficient time t2 has elapsed to permit the logic of the remainder of the chip 24 to reset, the controller 16 may send a second command 18 to the power up circuitry 12 to initiate a VCC regulation phase 58.

The VCC regulation phase 58 represents a final phase in powering up the memory device 10. In the VCC regulation phase 58, the power up circuitry 12 supplies the internal VCC 20 to the remainder of the chip 24 without limiting current. Thus, the VCC regulation phase 58 may represent normal memory device 10 operation once the device has powered up.

Figure 5:
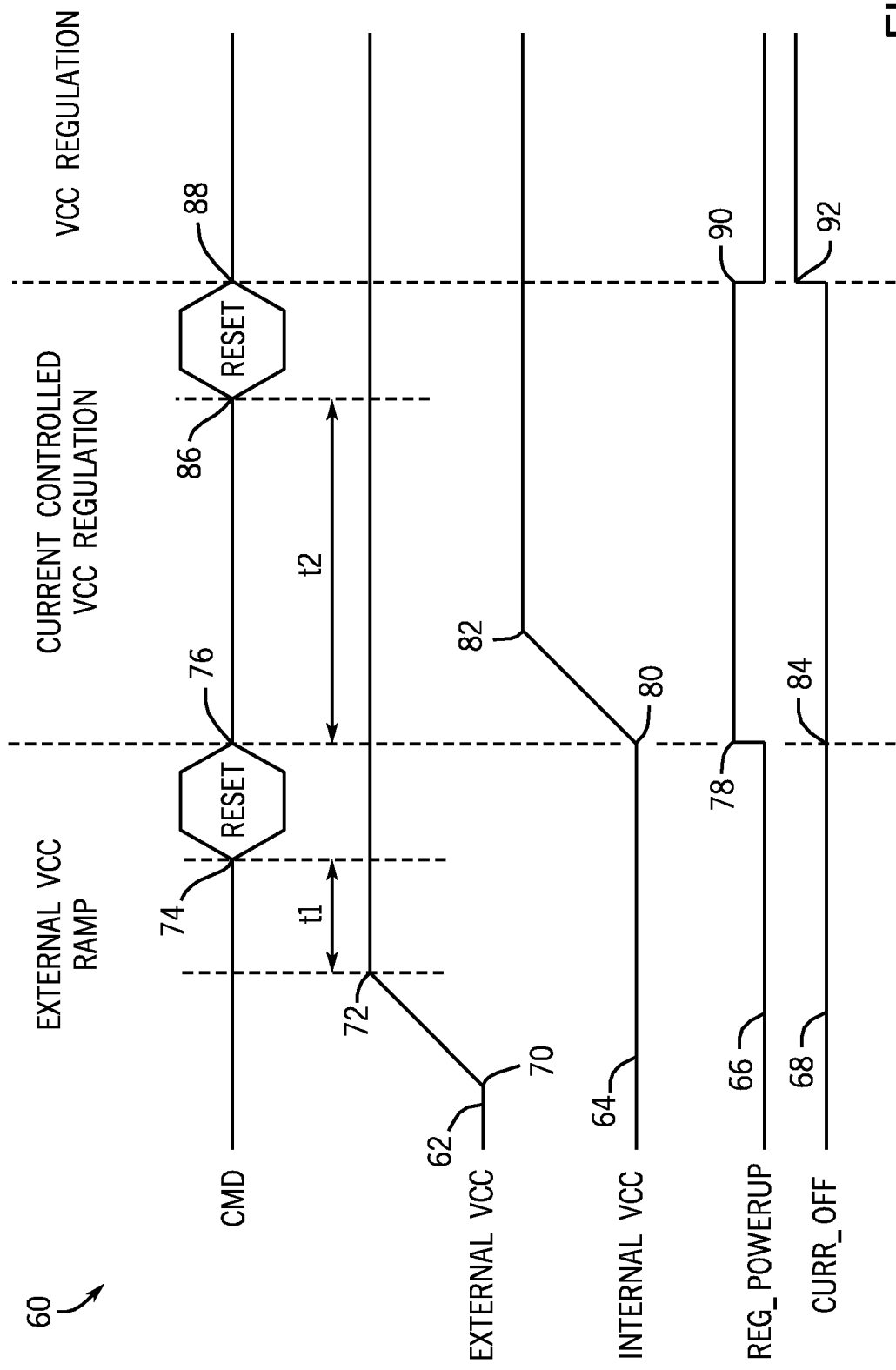
FIG. 5 is a timing diagram associated with the method of FIG. 4.

Turning to FIG. 5, a timing diagram 60 corresponds to the flowchart 52 of FIG. 4. The leftmost column of the timing diagram 60 indicates various voltage signals employed by the memory device 10. Such voltage signals include CMD, representing commands 18 from the controller 16; External VCC, representing the external VCC 14; Internal VCC, representing the internal VCC 20; reg_power up, representing a signal sent by the power up command logic 28 to activate the VCC regulator with current control 30; and curr_off, representing a signal sent by the power up command logic 28 to deactivate current limiter circuitry 44.

A first point 62 represents a point when the memory device 10 is off and no power is supplied at the start of the external VCC ramp phase 54. Accordingly, the external VCC 14 is low at point 62. Correspondingly, at point 64, the internal VCC 20 is also low. Representing the initial states of the power up command logic 28, at point 66, the VCC regulator power up signal reg_power up is low, and at point 68, the current control off signal curr_off is also low.

At point 70, the external VCC 14 begins to ramp up rising until reaching a maximum at point 72. Between points 70 and 72, the power up circuitry 12 is powered up. As noted on the timing diagram 60, the time t1 begins once the external VCC 14 has ramped to its peak at point 72. From the discussion above, the time t1 represents the amount of time for the external POR circuit 32 to reset the latches in the power up command logic 28. The time t1 may vary depending on the logic configuration and design and may last approximately 250 µs.

After the time t1 has elapsed, the controller 16 may send the first command 18 to the power up command logic 28 at point 74. Terminating at point 76, the command 18 may instruct the power up command logic 28 to initiate a subsequent power up phase. Although the command 18 illustrated in the timing diagram 60 is a reset command, any predetermined command may be chosen. As should be appreciated, the command 18 should be chosen such that the power up command logic 28 may initiate the current controlled VCC regulation phase 58 upon the receipt of the first command 18.

With further reference to the timing diagram 60 of FIG. 5, when the command 18 is received at point 76, the current controlled VCC regulation phase 56 may begin. The power up command logic 28 subsequently sets the VCC regulator power up signal reg_power up to high at point 78, which activates the VCC regulator with current control 30. The VCC regulator with current control 30 may thereafter begin to output the internal VCC 20 at point 80. The voltage of the internal VCC 20 may ramp until a reference voltage is reached at point 82.

During the current controlled VCC regulation phase 56, only the VCC regulator with current control 30 is activated. This result arises because the VCC regulator power up signal reg_power up is high while the current control off signal curr_off is low, as indicated by point 84. It should be recalled that the time t2, which takes place from the start of the current controlled VCC regulation phase 56, represents the amount of time for the internal POR circuit 22 to reset the latches in the remainder of the chip 24. The time t2 may vary depending on the configuration and design of the remainder of the chip 24 and may last approximately 250 µs.

After the time t2 has elapsed, the controller 16 may send a second command 18 to the power up command logic 28 at point 86. Terminating at point 88, the second command 18 may instruct to the power up command logic 28 to initiate a subsequent power up phase. Although the second command 18 illustrated in the timing diagram 60 is a reset command, any predetermined command may be chosen. As should be appreciated, the second command 18 should be chosen such that the power up command logic 28 may initiate the VCC regulation phase 58 upon the receipt of the second command 18.

Upon receipt of the second command 18, the VCC regulation phase 58 may begin. As described above, the VCC regulation phase 58 represents the start of normal memory device 10 operation. Thus, the power up command logic 28 subsequently deactivates the current limiter circuit 44 in the VCC regulator with current control 30 and activates the VCC regulator 36. This is reflected by points 90 and 92 in the timing diagram 60, which indicate that the VCC regulator power up signal is set to low at point 90 and that the current control off signal is set to high at point 92. Subsequently, the VCC regulator 36 and the VCC regulator with current control 30 (with current control now deactivated) may provide a constant voltage supply to the memory device 10.

Figure 6:
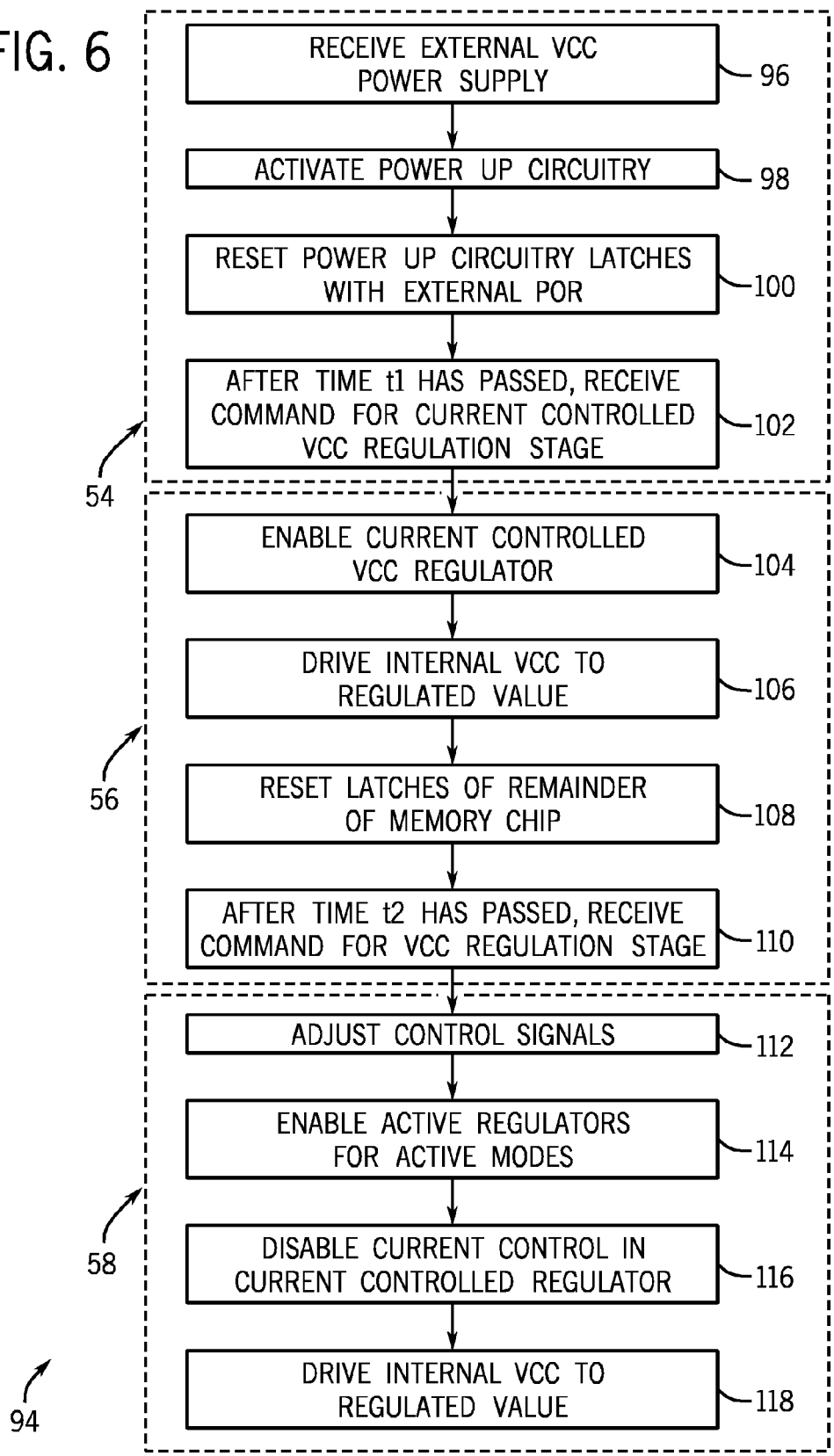
FIG. 6 is a flowchart describing the method of FIG. 4 in greater detail.

FIG. 6 illustrates a flowchart 94 depicting a more detailed description of the method outlined in the flowchart 52 of FIG. 4. In the flowchart 94, steps 96 through 102 take place during the external VCC ramp phase 54. In step 96, the external VCC 14 power supply ramps up. The power up circuitry 12 of the memory device 10 receives power from the external VCC 14 in step 98, and the power up circuitry 12 begins to power up. At this point, the standby band gap circuit 34 may begin to output a reference voltage 40 (also labeled Vref), which may be used in subsequent power up phases by the VCC regulator with current control 30 and the VCC regulator 36. In a next step 100, the external POR circuit 32 supplies a reset signal 38 to the power up command logic 28, resetting the latches of the power up command logic 28. A final step 102 of the external VCC ramp phase 54 takes place after the time t1 has elapsed, allowing sufficient time for the latches of the power up command logic 28 to reset. In step 102, the first command 18 may be received by the power up command logic 28, in advance of the current controlled VCC regulation phase 56.

Steps 104-110 of the flowchart 94 take place during the current controlled VCC regulation phase 56. In step 104, the power up command logic 28 may provide a signal, such as the VCC regulator power up signal, reg_power up, indicated in the timing diagram 60 of FIG. 5, to logic within the VCC regulator with current control 30 and the VCC regulator 36. Based on the logic within the VCC regulator with current control 30 and the VCC regulator 36, only the VCC regulator with current control 30 may be activated. In step 106, the VCC regulator with current control 30 drives the internal VCC 20 to the regulated value without exceeding a maximum peak current limit. For example, the peak current limit may be set to between 4 mA to 20 mA, preventing spikes in current drawn from the external VCC 14. In a next step 108, the internal POR circuit 22 supplies a reset signal 26 to the remainder of the chip 24, resetting the latches of the remainder of the chip 24. A final step 110 of the current controlled VCC regulation phase 56 takes place after the time t2 has elapsed, allowing sufficient time for the latches of the remainder of the chip 24 to reset. In step 110, the power up command logic 28 may receive the second command 18 in advance of the next phase in powering up, normal VCC regulation phase 58.

Referring further to the flowchart 94 of FIG. 6, steps 112-118 represent steps taking place during the normal VCC regulation phase 58. In step 112, after receiving the second command 18, the power up command logic 28 may set the VCC regulator power up signal reg_power up to low and set the current control off signal curr_off is to high. In step 114, the active regulators in the VCC regulator with current control 30 and the VCC regulator 36 may be enabled for active modes as the VCC regulator power up signal reg_power up is set low, and in step 116, the current limiter circuit 44 in the VCC regulator with current control 30 may be disabled as the current control off signal curr_off is set high. Thus, by step 118, the VCC regulator with current control 30 (with the current control disabled) and the VCC regulator 36 may operate in tandem to drive the internal VCC 20. During step 118, the internal VCC 20 may be driven to the reference voltage 40 without the active current limitation of the current controlled VCC regulation phase.

Figure 7:
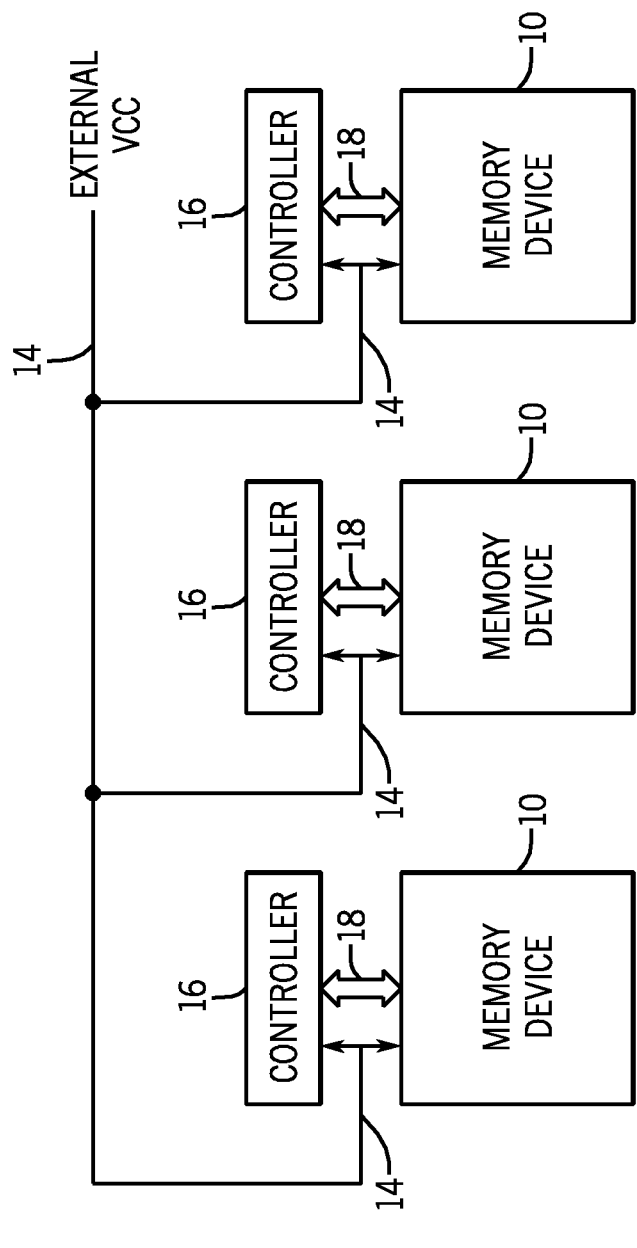
FIG. 7 is a block diagram representing a plurality of memory devices having command based and current limit controlled power up circuitry.

Turning next to FIG. 7, a block diagram 120 depicts a plurality of memory devices 10 having command based and current limit controlled power up circuitry in accordance with an embodiment. As shown in the block diagram 120, the external VCC 14 supplies power to the plurality of memory devices 10 and to a corresponding plurality of controllers 16.

Though the block diagram 120 depicts only three memory devices 10, any number of memory devices 10 may be employed. Moreover, it should be appreciated that, alternatively, a single controller 16 may control all of the memory devices 10 in lieu of the plurality of controllers 16. Because powering up numerous memory devices 10 in parallel may draw excessive current from the external VCC 14, the command based and current limit controlled power up circuitry of the memory devices 10 may be employed to power each memory device 10 individually upon issuance by the controllers 16 of the commands 18.

Figure 8:
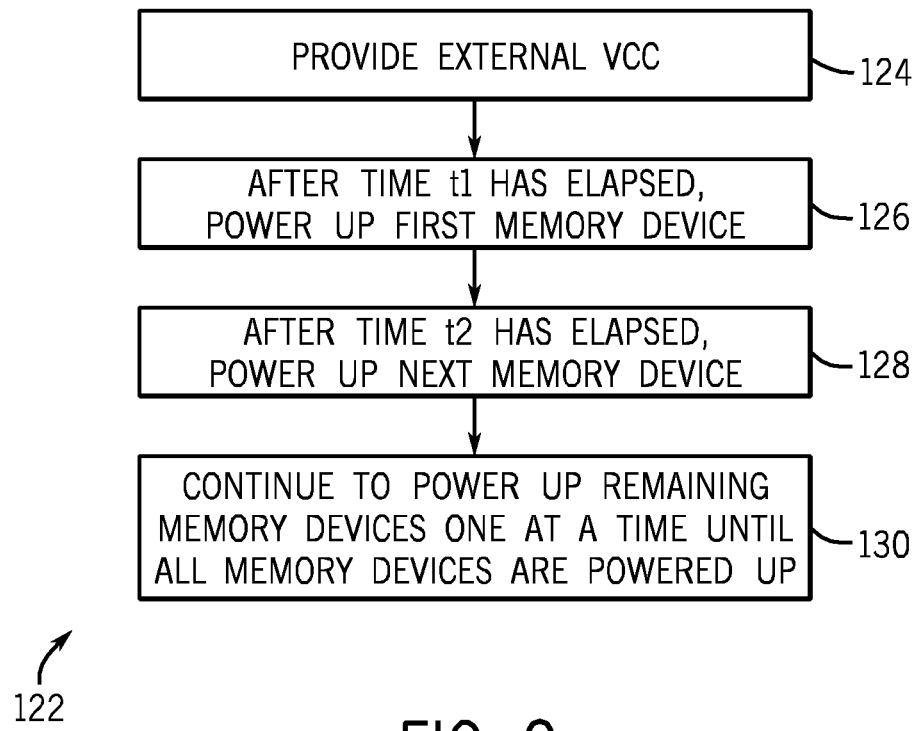
FIG. 8 is a flowchart describing a method of powering up the plurality of memory devices of FIG. 7 in accordance with an embodiment.

FIG. 8 is a flowchart 122 depicting a method of powering up the plurality of memory devices 10 of the block diagram 120 of FIG. 7. In a first step 124, the external VCC 14 is ramped up and supplied to the plurality of memory devices 10 and the plurality of controllers 16. The first step 124 represents the external VCC ramp phase 54 of the flowchart 52 of FIG. 4.

Step 126 takes place after a sufficient time t1 has elapsed for the latches of the command based and current limit controlled power up circuitry of the memory devices 10 to reset. In step 126, a first of the controllers 16 may issue a command 18 to a first of the memory devices 10 to initiate the current controlled VCC regulation phase 56 in the first of the memory devices 10.

Step 128 takes place after a sufficient time t2 has elapsed for the latches of the remainder of the circuitry of the first of the memory devices 10 to reset. In step 128, the first of the controllers 16 may complete the power up of the first of the memory devices 10 by issuing a command 18 for the first of the memory devices 10 to initiate the VCC regulation phase 58. At the same time, a second of the controllers 16 may issue a command 18 to a second of the memory devices 10 to initiate the current controlled VCC regulation phase 56 in the second of the memory devices 10.

As indicated in step 130, the above process may continue until all of the memory devices 10 have powered up. In this way, the current drawn by all of the memory devices 10 may be limited substantially from powering all of the memory devices 10 in parallel.

Figure 9:
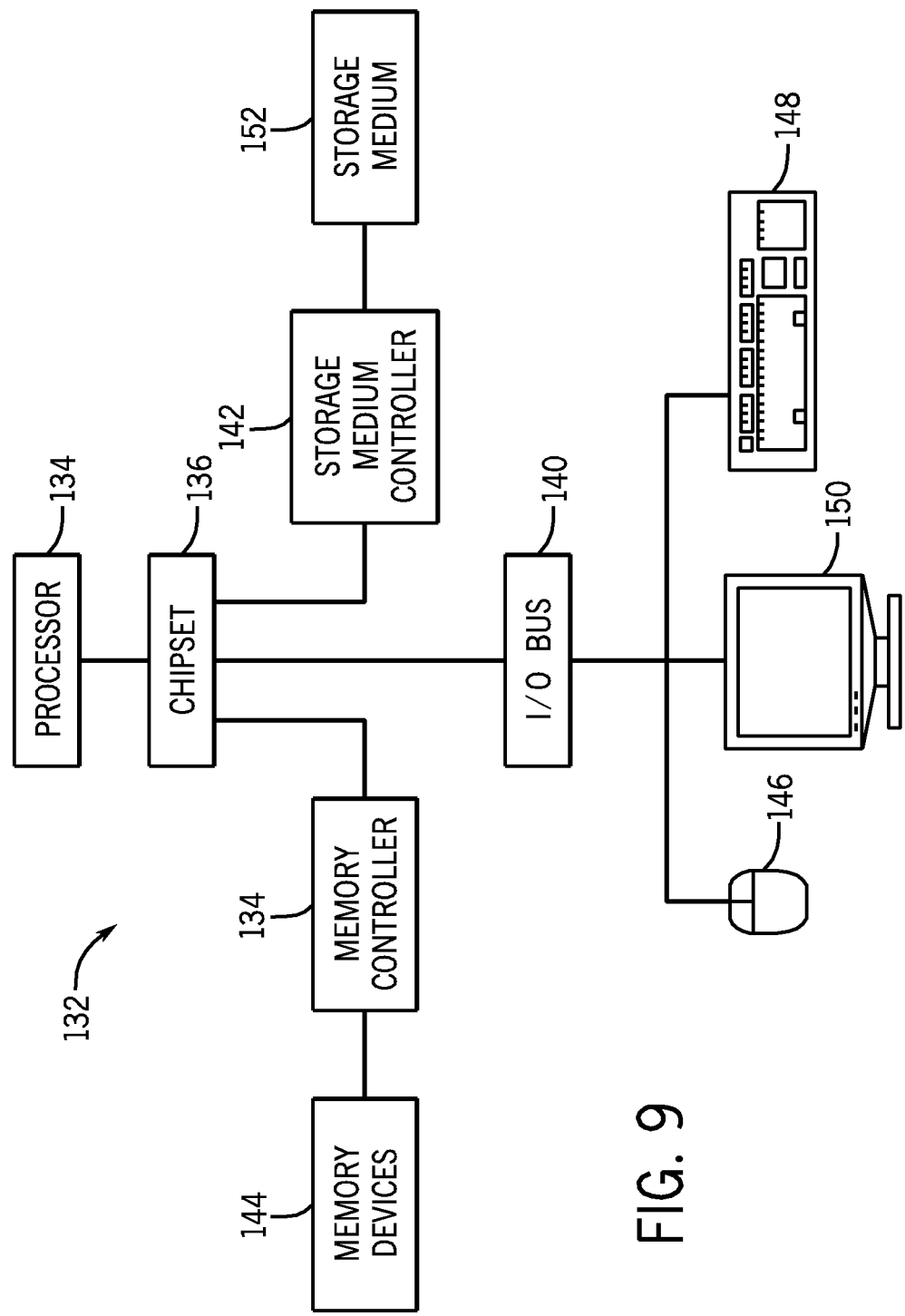
FIG. 9 is a block diagram illustrating a system employing the memory device of FIG. 1 in accordance with an embodiment.

FIG. 9 illustrates a system 132 employing one or more memory devices 10 having command based and current limit controlled power up circuitry. The system 132 may form, for example, a desktop computer, a notebook computer, a server, a handheld computer, or a portable device, such as a portable phone or media player. The system 132 may include one or more processors, such as a central processing unit ("CPU") 134. The CPU 134 may be used individually or in combination with other CPUs. In one embodiment of the invention, the CPU 134 may include one or more memory devices 10.

A chipset 136 may be operably coupled to the CPU 134. The chipset 136 operates as a communication pathway for signals between the CPU 134 and other components of the system 132. Such other components include, for example, a memory controller 134, which may, in some embodiments, represent the controller 16; an input/output bus 140; and a storage medium controller 142, which may, in some embodiments, additionally or alternatively represent the controller 16. As should be appreciated by those skilled in the art, the memory controller 134, the input/output bus 140, and the storage medium controller 142 may alternatively be incorporated into the chipset 136.

One or more memory devices 144, which may represent one or more memory devices 10 in some embodiments, may be operably coupled to the memory controller 134. The memory devices 144 may represent volatile memory, such as synchronous dynamic random access memory (SDRAM), but may also represent non-volatile memory such as Flash memory. It should be noted that while the memory devices 144 may represent one or more memory devices 10, in some embodiments the memory devices 144 may represent ordinary memory without command based and current limit controlled power up circuitry. The input/output bus 140 may permit the chipset 136 to communicate with a pointing input device 146, such as a mouse; a keyboard input device 148, such as a keyboard; and a display device 150.

A non-volatile storage medium 152, which may represent one or more memory devices 10 in some embodiments, may be operably coupled to the storage medium controller 142. The non-volatile storage medium 152 may represent an internal disk drive or non-volatile memory, such as Flash memory. It should be noted that while the non-volatile storage medium 152 may represent one or more memory devices 10, in some embodiments the non-volatile storage medium 152 may represent ordinary non-volatile memory without command based and current limit controlled power up circuitry.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
 power up circuitry disposed internal to the memory device and configured to receive an external power supply and to provide an internal power supply to the memory device upon receipt of a command by the power up circuitry from a memory device controller disposed external to the memory device.

2. The memory device of claim 1, wherein the internal power supply is limited to a peak current.

3. The memory device of claim 1, wherein the internal power supply is not limited to a peak current.

4. The memory device of claim 1, wherein the power up circuitry comprises power up command logic configured to receive a command and to cause an internal vcc regulator with current control to provide the internal power supply to the memory device, wherein the internal power supply is limited to a peak current.

5. The memory device of claim 4, wherein the power up command logic is configured to output a digital power up vcc regulation control signal to cause the internal vcc regulator with current control to provide the internal power supply to the memory device, wherein the digital power up vcc regulation control signal is set to high or low.

6. The memory device of claim 5, wherein the power up command logic is configured to receive another command and to output the inverse of the digital power up vcc regulation control signal to cause an internal vcc regulator to provide the internal power supply to the memory device, wherein the internal power supply is not limited to the peak current.

7. The memory device of claim 4, wherein the power up command logic is configured to receive another command and to cause an internal vcc regulator to provide the internal power supply to the memory device, wherein the internal power supply is not limited to the peak current.

8. The memory device of claim 4, wherein the power up command logic is configured to receive another command and to cause the internal vcc regulator with current control to provide the internal power supply to the memory device, wherein the internal power supply is not limited to the peak current.

9. The memory device of claim 1, wherein the power up circuitry comprises an internal vcc regulator, the internal vcc regulator comprising current limiting circuitry.

10. The memory device of claim 9, wherein the current limiting circuitry comprises a current mirror.

11. A system comprising:
- a processor; and
- a memory device disposed external to the processor, the memory device comprising power-up circuitry configured to receive an external power supply and to provide an internal power supply to the memory device upon receipt of a command; and
- a controller disposed externally from and coupled to the memory device, wherein the controller is configured to provide the command to the memory device.

12. The system of claim 11, wherein the power up circuitry comprises power up command logic configured to receive the command and to cause an internal vcc regulator with current control to provide the internal power supply to the memory device, wherein the internal power supply is limited to a peak current.

13. The system of claim 12, wherein the power up command logic is configured to receive another command and to cause an internal vcc regulator to provide the internal power supply to the memory device, wherein the internal power supply is not limited to the peak current.

14. The system of claim 11, wherein the memory device is selected from a group consisting of synchronous dynamic random access memory, NOR Flash memory, and NAND Flash memory.

15. The system of claim 11, wherein the memory device is selected from a group consisting of SPI NAND Flash memory and parallel NAND Flash memory.

\* \* \* \* \*